United States Patent [19]

Schweitzer, Jr.

[11] Patent Number: 5,363,088
[45] Date of Patent: Nov. 8, 1994

[54] VOLTAGE MONITOR FOR ALTERNATING CURRENT POWER SYSTEM

[76] Inventor: Edmund O. Schweitzer, Jr., 2433 Center St., Northbrook, Ill. 60062

[21] Appl. No.: 994,624

[22] Filed: Dec. 21, 1992

[51] Int. Cl.$^5$ .................................. G08B 21/00
[52] U.S. Cl. .................. 340/660; 340/635; 324/133
[58] Field of Search .............. 340/660, 661, 662, 663, 340/635; 324/133; 361/286

[56] References Cited

U.S. PATENT DOCUMENTS

| | | | |
|---|---|---|---|
| 3,614,610 | 10/1971 | Legatti | 324/115 |
| 3,660,757 | 5/1972 | Winslow | 324/122 |
| 3,667,039 | 5/1972 | Garfein et al. | 324/92 |
| 3,774,195 | 11/1973 | Schulthess et al. | |
| 4,139,820 | 2/1979 | Rode | 324/133 |
| 4,152,639 | 5/1979 | Chaffee | 324/51 |
| 4,152,643 | 5/1979 | Schweitzer, Jr. | 324/120 |
| 4,259,634 | 3/1981 | Okamoto et al. | 324/74 |
| 4,301,407 | 11/1981 | Koslar | 324/96 |
| 4,458,198 | 7/1984 | Schwetizer, Jr. | 324/133 |
| 4,503,389 | 3/1985 | Singer | 324/133 |
| 4,550,288 | 10/1985 | Schwetizer, Jr. | 324/133 |
| 4,559,496 | 12/1985 | Harnden, Jr. et al. | 324/127 |
| 4,641,220 | 2/1987 | Schwetizer, Jr. | 361/187 |
| 4,714,916 | 12/1987 | Schweitzer, Jr. | 340/664 |
| 4,823,078 | 4/1989 | Mohebban | 324/133 |
| 5,070,301 | 12/1991 | Schweitzer, Jr. | 340/664 X |

FOREIGN PATENT DOCUMENTS 1011161 12/1948 France .
1199016 7/1970 United Kingdom .

OTHER PUBLICATIONS

"Liquid Crystal Display", a publication of Hamlin Inc., Lake and Grove Streets, Lake Mills, Wis., circa Jun. 1, 1989.

"Electronically Scanned Analog Liquid Crystal Displays", by R. A. Soref, *Applied Optics*, Jun. 1970, vol. 9, No. 6.

Primary Examiner—Jeffery A. Hofsass
Attorney, Agent, or Firm—Lockwood, Alex, FitzGibbon & Cummings

[57] ABSTRACT

A voltage monitoring device for an AC power distribution system utilizes a liquid crystal optical shutter device capacitively coupled between a conductor of the system and electrical ground such that the transparency of the optical shutter device to light varies with the system voltage level. A light source projects a light beam through the optical shutter device to a light detector such that the output of the light detector is dependent on the system voltage. A control circuit responsive to the output of the light detector provides an output signal when the system voltage falls outside of a predetermined operating range.

15 Claims, 4 Drawing Sheets

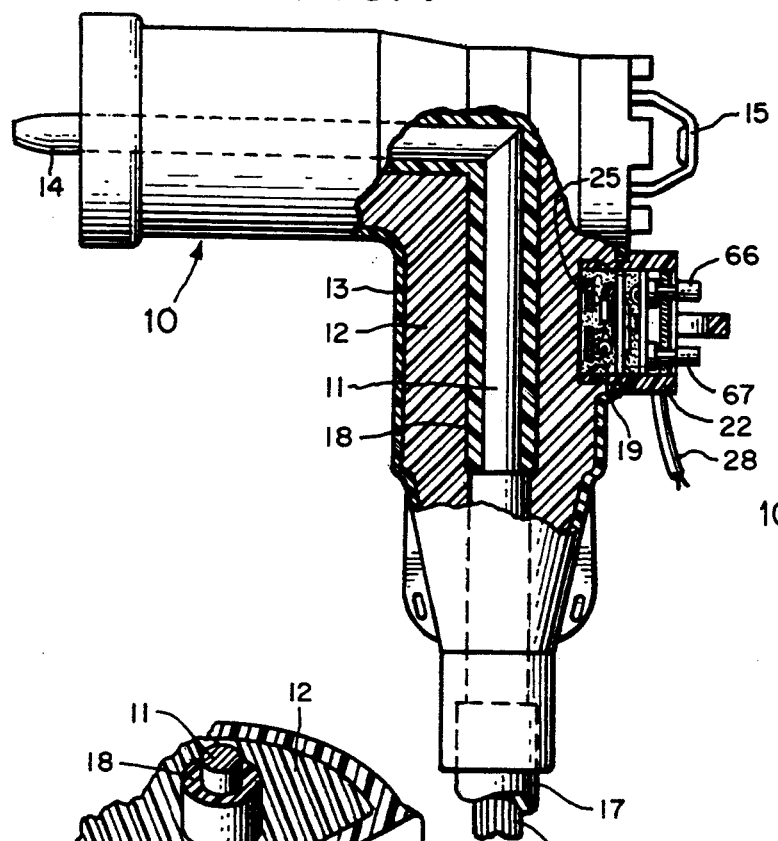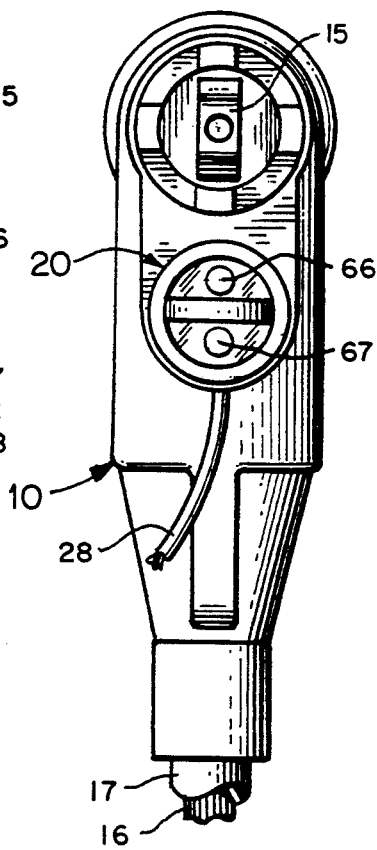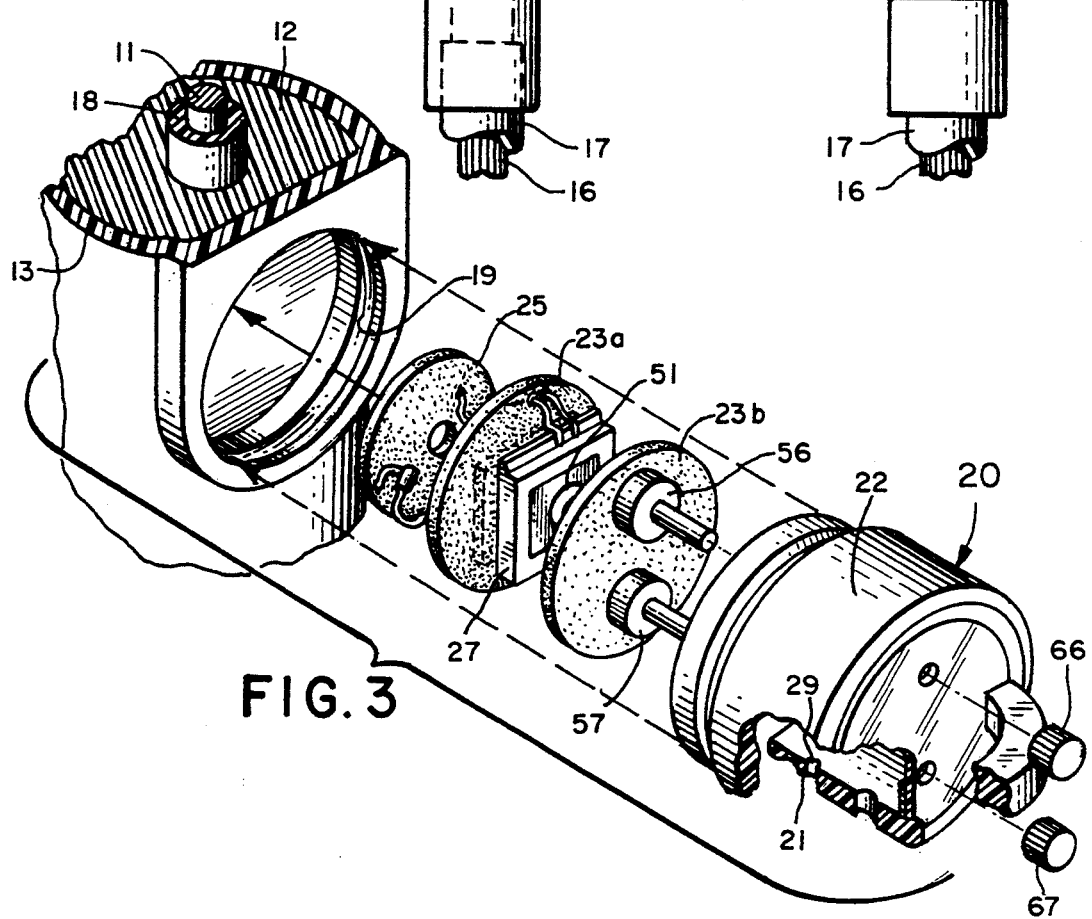

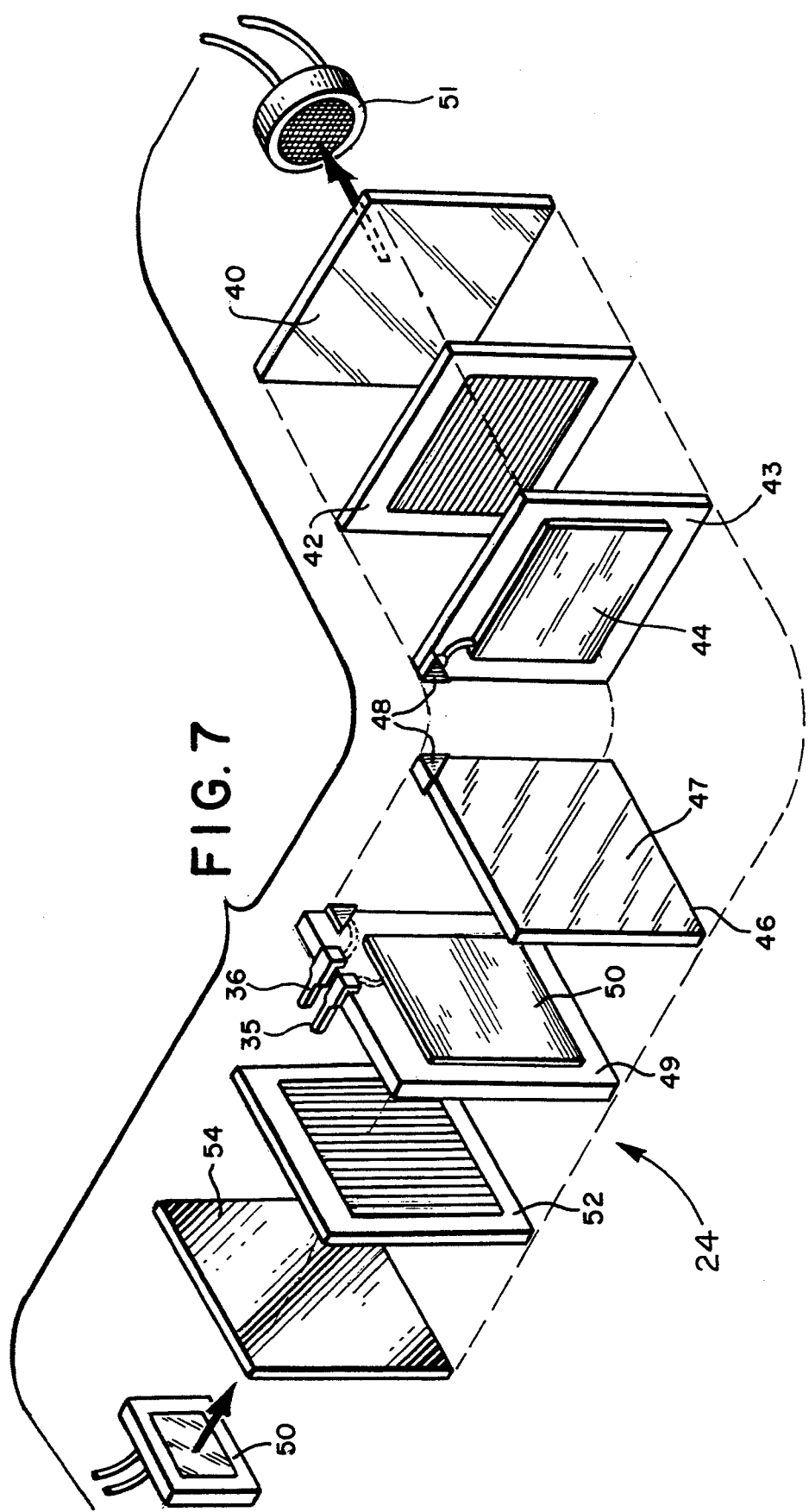

VOLTAGE MONITOR FOR ALTERNATING CURRENT POWER SYSTEM

BACKGROUND OF THE INVENTION

In larger AC power distribution systems it is frequently necessary to switch to alternate power sources. This is particularly true in systems feeding critical loads, where an alternate source may be switched to in the event of failure of a primary source.

Prior to switching to such an alternate source it is desirable to ascertain that the alternate source is at the correct voltage level. Because of the high operating voltages involved and the necessity of maintaining electrical isolation between the alternate source and ground, this has in the past been difficult and expensive to accomplish. Typically, potential transformers have been required in association with the alternate source, together with extensive monitoring equipment for analyzing the output of the transformers.

In contrast, the present invention provides a self-contained voltage monitor which can be installed over existing conventional test points associated with an AC system and does not require the use of potential transformers and associated monitoring circuitry. In the event of a low voltage condition, and, if desired, in the event of a high voltage condition, the monitor provides a control signal which can be utilized to sound an alarm, or to inhibit switching to the alternate source, either locally or at a remote location.

Thus, the present invention provides a voltage monitor particularly well suited for monitoring the voltage of an AC power system of the type commonly used for supplying electrical power to large industrial loads.

Accordingly, it is a general object of the present invention to provide a new and improved voltage monitor for an AC electrical power system.

It is a more specific object of the present invention to provide a voltage monitor for an AC power system wherein electrical isolation is maintained between the system and electrical ground.

It is a further object of the present invention to provide a voltage monitor which is reliable in operation and economical to construct and which may be conveniently installed on the conductors of an existing AC power system.

SUMMARY OF THE INVENTION

A voltage monitor for monitoring the voltage level of an AC power system comprises a high impedance optical shutter device having a pair of control electrodes disposed in operative association with a layer of voltage-responsive light controlling material, first circuit means for capacitively coupling the electrodes of the high impedance optical shutter device to the system whereby the transparency of the device to light varies as a function of the voltage level of the system, and second circuit means including a photodetector responsive to the transparency of the optical shutter for producing a control signal upon the system voltage falling outside of a predetermined range.

A voltage monitor for monitoring the voltage level of an AC power system further comprises a high impedance optical shutter device having a pair of control electrodes disposed in operative association with a layer of voltage-responsive light controlling material, first circuit means for capacitively coupling the control electrodes of the high impedance optical shutter device to the system whereby the transparency of the device to light varies as a function of the voltage level of the system, a light source adapted to direct a beam of light through the optical shutter device, a light detector adapted to receive the beam of light after transmission through the optical shutter device and to produce an output dependent on the amplitude of the light incident on the detector, and second circuit means responsive to the output of the light detector for producing a control signal upon the system voltage falling outside a predetermined range.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numerals identify like elements, and in which:

FIG. 1 is an enlarged side elevational view partially in section of a conventional elbow connector showing a voltage monitor constructed in accordance with the invention.

FIG. 2 is a front elevational view of the elbow connector of FIG. 1.

FIG. 3 is an exploded perspective view illustrating the voltage monitor installation on the test point of the elbow connector of FIGS. 1 and 2.

FIG. 7 is an enlarged partially-exploded perspective view of the liquid crystal optical shutter device utilized in the three-phase voltage monitor of FIGS. 1-6.

DESCRIPTION OF THE PREFERRED EMBODIMENT

Figure 4:
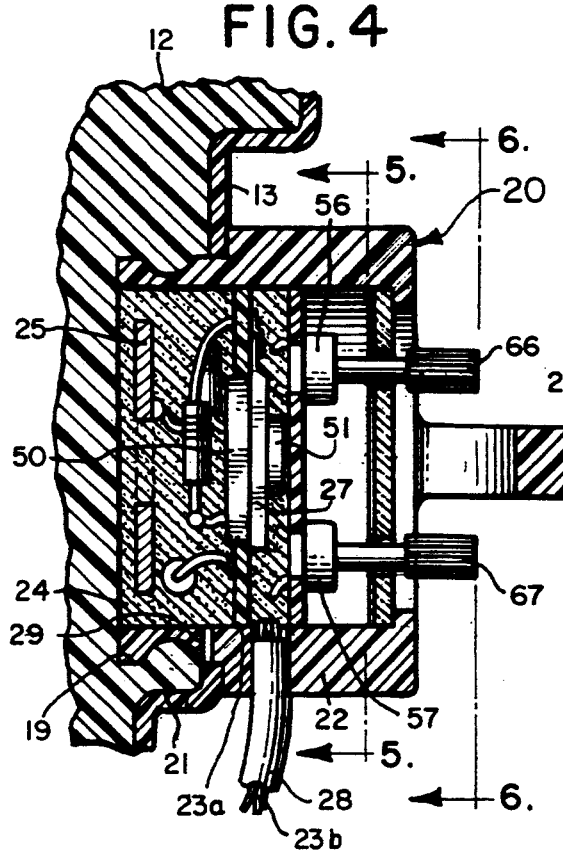
FIG. 4 is an enlarged cross-sectional view of the voltage monitor of FIGS. 1-3 installed on the test point and showing representative placement of circuitry therein.
Figure 5:
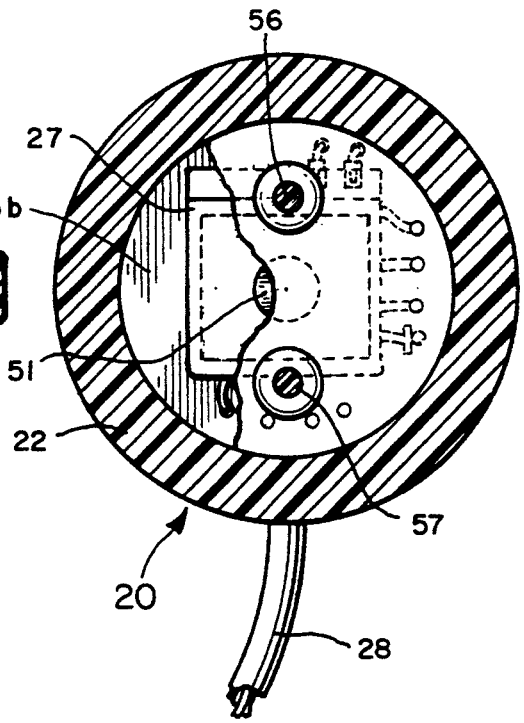
FIG. 5 is an enlarged cross-sectional view of the voltage monitor taken along line 5—5 of FIG. 4.
Figure 6:
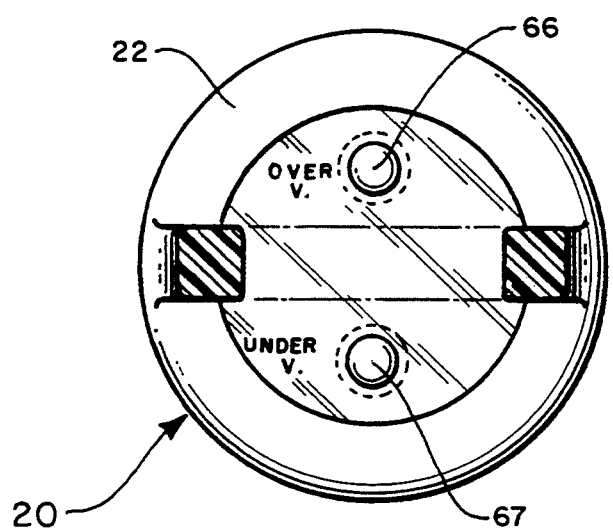
FIG. 6 is an enlarged cross-sectional of the voltage monitor taken along line 6—6 of FIG. 4.

Referring to the drawings, and particularly to FIGS. 1-6, a plug-in type elbow connector for use in high voltage alternating current power distribution systems for establishing a plug-in connection to a transformer or other system component (not shown) is identified generally by reference numeral 10. As shown, the connector 10 includes generally a conductor 11 extending generally axially through an electrically non-conductive body portion 12 encased in an electrically-conductive sheath 13, the sheath being grounded in accordance with conventional practice. An electrically-conductive contact member 14 extends from conductor 11 to mate with a complementary contact (not shown) on the associated system component. An arcuate member 15 having ends anchored in the conductive sheath 13 extends from the connector to receive the hooked end of a lineman's tool. The axial conductor 11 is connected, in accordance with conventional practice, to the conductor 16 of a flexible cable 17 of the type commonly utilized in power distribution systems. A layer 18 of semiconductive material may be provided around conductor 11 to provide stress relief for the electric field within the connector in a manner well known to the art.

To provide for detecting fault currents or the voltage level in conductor 11 connector 10 includes a test point socket 19 for receiving a voltage monitoring module 20. The test point socket 19, which is preferably constructed as described in U.S. Pat. No. 4,904,932 of the present inventor, is formed within the insulating body portion of the connector, extending through the electrically-conductive outer sheath 13. In particular, this socket preferably cylindrical in form and of an axial extent such that the test point socket 19 receives a substantial portion of the housing.

The voltage monitoring module 20 is seen in FIGS. 3–6 to include a generally cylindrical housing 22 formed of an electrically conductive rubber or similar semi-resilient material within which the electrical components of the voltage monitor are contained. In particular, within housing 22 the voltage monitor module includes two disc-shaped insulator boards 23a and 23b positioned perpendicularly to the axis of the housing at a location intermediate the ends thereof, and a layer 24 (FIG. 4) of high electrical resistance potting compound at the inside end of the housing for securing the insulator board in place. Additional electrical components included in housing 22 include a capacitive coupling element in the form of a metallic plate 25 for capacitively coupling the circuitry of the voltage monitor to conductor 11, and a high impedance optical and shutter device 27 for remotely indicating the occurrence of a fault current.

The voltage level on conductor 11 is derived by means of the metallic plate 25, which when module 20 is seated in test point socket 19 is sufficiently closely spaced to the conductor to provide a level of capacitive coupling whereby an adequate alternating voltage is derived from the conductor. A necessary ground return for this circuitry may be provided, as shown in FIGS. 1–5, by an electrical conductor 29 which extends through an aperture 21 in the sidewall of housing 22. When housing 22 is seated in test point socket 19 conductor 29 is brought into electrical communication with the electrically grounded sheath 13 of the elbow connector.

A flexible multi-conductor cable 28 associated with the component 16 provides an electrical connection to an associated alarm or control unit (not shown) with which the voltage monitoring device may be associated.

In operation, the liquid crystal optical shutter device has a transmissivity to light which varies as a function of applied voltage. Electrical connections are made with the device by means of two electrically conductive terminals 35 and 36 arranged along the top edge of the component.

Internally, as shown in FIG. 7, the liquid crystal display optical shutter device 27 generally includes a transparent face plate 40, a first polarizer 42, a glass plate 43 on which a transparent backplane electrode 44 is provided, a perimeter seal 46 containing a layer 47 of twisted nematic liquid crystal material, electrically conductive edge contacts 48, a glass plate 49 on which a transparent indicator segment is contained, a second polarizer 52 aligned at right angles to the first polarizer 42, and a transparent rear supporting plate 54.

Optical shutter component 27 may be conventional in construction and operation. The shutter is formed by the nematic liquid crystal layer 47, which in the absence of an applied electric field has the property of rotating the polarization of light as it passes through the molecular layers of the layer. In particular, only vertically polarized light passes through polarizer 52. The absence of an applied electric field, the polarization of this polarized light is rotated 90° as it passes through the nematic liquid crystal layer 47 and reaches polarizer 42. Since the polarization of the light has been rotated the light is able to pass through this polarizer and on through transparent plate 90.

However, when an electric field is applied between electrode 50 and electrode 44 the dielectric liquid crystal layer is subjected to electrostatic stress, which causes it to further rotate the polarized light from the first polarizer beyond 90°. Consequently, less light is able to pass through the second polarizer, and the transmission of light through the optical shutter is reduced.

Figure 8:
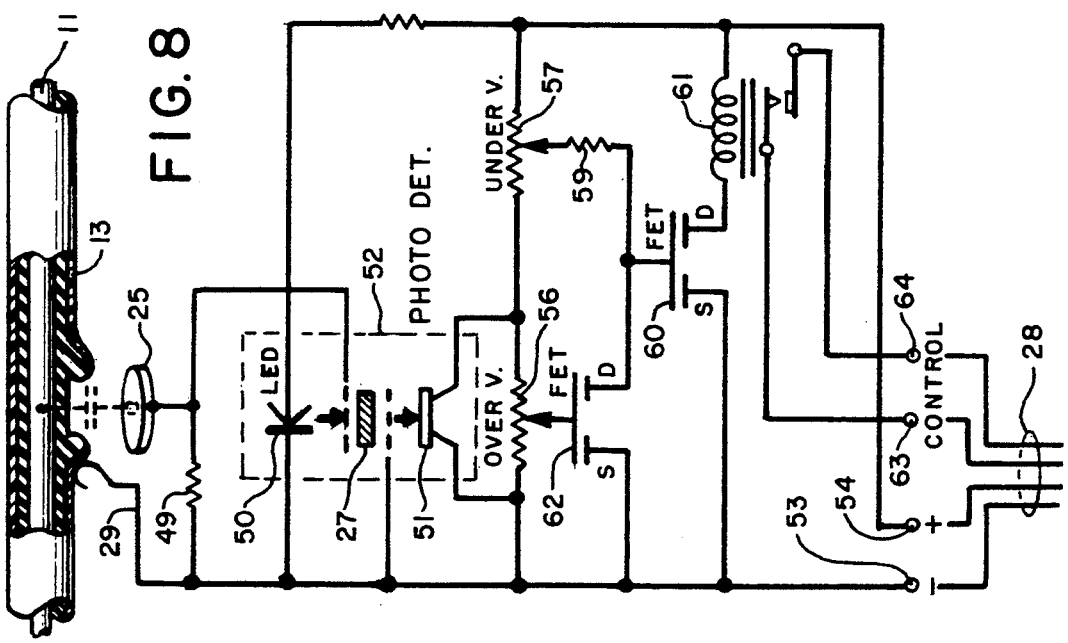
FIG. 8 is a schematic diagram of the three-phase voltage monitor of FIGS. 1-6.

Referring to FIG. 8, the voltage sensing signal developed at electrode 25 is applied to one electrode of the liquid crystal optical shutter device 27. The other terminal of the device is connected to electrical ground through conductor 29. Thus connected, the optical shutter device 27 has a net transparency to light which accurately reflects the voltage level in the monitored system. A shunt-connected resistor 49 is selected such that the portion of the sensed voltage applied to the LCD optical shutter is within the middle of the LCD's operating range.

In accordance with the invention, a light emitting diode (LED) 50 is provided within housing 22 to generate a light beam which projects through the optical shutter device 40. After passing through the device the beam is received by a Darlington phototransistor 51, which provides an impedance change with changes in the intensity of incident light. The LCD optical shutter 27, LED 50 and phototransistor 51 may be arranged in a compact assembly 52 which provides electrical isolation between the sensing circuits associated with the optical shutter 27 and monitored conductor 11, and the control circuitry associated with phototransistor 41.

The shutter-controlled light from LED 40 activates phototransistor 51 to produce an impedance change in the device as an inverse function of light intensity. Current supplied by an external power supply, typically, for example, a 24 VDC supply connected through cable 28 to terminals 43 and 44, produces a voltage drop across an overvoltage potentiometer 56 and an under-voltage potentiometer 57. The voltage at the arm of potentiometer 57, which depends on the conductivity of photodetector 51, is applied to an FET 60 through resistor 59 and switches FET 60 into conduction when the threshold of the FET, typically in the order of 3 volts, is exceeded.

Since the optical transparency of optical shutter 27 decreases with increasing applied voltage, increasing system voltage increases the impedance of photodetector 51. Until the system voltage rises to a user-selected minimum level, FET 60 is non-conductive. However, when the system voltage rises above the minimum level the threshold voltage of FET 60 is exceeded, the FET becomes conductive, and a relay 61 is actuated. A further increase in system voltage above a user-selected maximum level causes the threshold of an FET 62 to be exceeded, rendering that device conductive and grounding the gate of FET 60. This in turn renders FET 60 non-conductive, and deenergizes relay 61. Thus, the relay is actuated only when the system voltage falls within a permissible range, and is not actuated during high or low conditions.

By selecting resistor 49 the LCD optical shutter 27 is made to operate mid-range for a given system operating voltage. Potentiometer 57 is adjusted to actuate relay 61 upon the source exceeding a predetermined minimum under-voltage level. Potentiometer 56 is adjusted to open the relay contacts upon the voltage of the monitored system reaching a predetermined over-voltage level. Thus, relay 61 is energized only when the voltage level of the monitored source is within an acceptable range. The relay contacts are connected to terminals 63 and 64, and from there through cable 28 to external alarm or control circuitry.

In operation, light generated by LED 50 entering LCD 27 through face plate 54 passes through polarizer 52, which, in the illustrated embodiment, provides a vertical polarization. The polarized light then passes through electrode 50 to nematic liquid crystal layer 47, wherein, in the absence of an applied electric field, it is rotated 90°. The rotated light, now horizontally polarized, passes through electrode 44, horizontal polarizer 42 and face plate 40 to photo transistor 51. When an increasing electric field is applied to layer 47 by applying a voltage to electrodes 50 and 44 at terminals 35 and 36, nematic layer 47 increasingly rotates the polarized light beyond 90°, which is increasingly unable to pass through polarizer 42. Consequently, the net transmission of light through LCD optical shutter device 27 decreases with increasing voltage.

As shown in FIGS. 3 and 4, the components of the voltage monitor are preferably mounted on circuit boards 23a and 23b within housing 22. Potentiometers 56 and 57 preferably extend through the front on the housing and may be provided with removable caps 66 and 67 for access by the user. Terminals 53, 54, 63 and 64 may be accessed through individual conductors within cable 28. In practice, cable 25 may be of sufficient length to extend to a control or junction box (not shown) wherein a power supply suitable for operating relay 61, LED 50 and FETs 60 and 62 may be provided.

Figure 9:
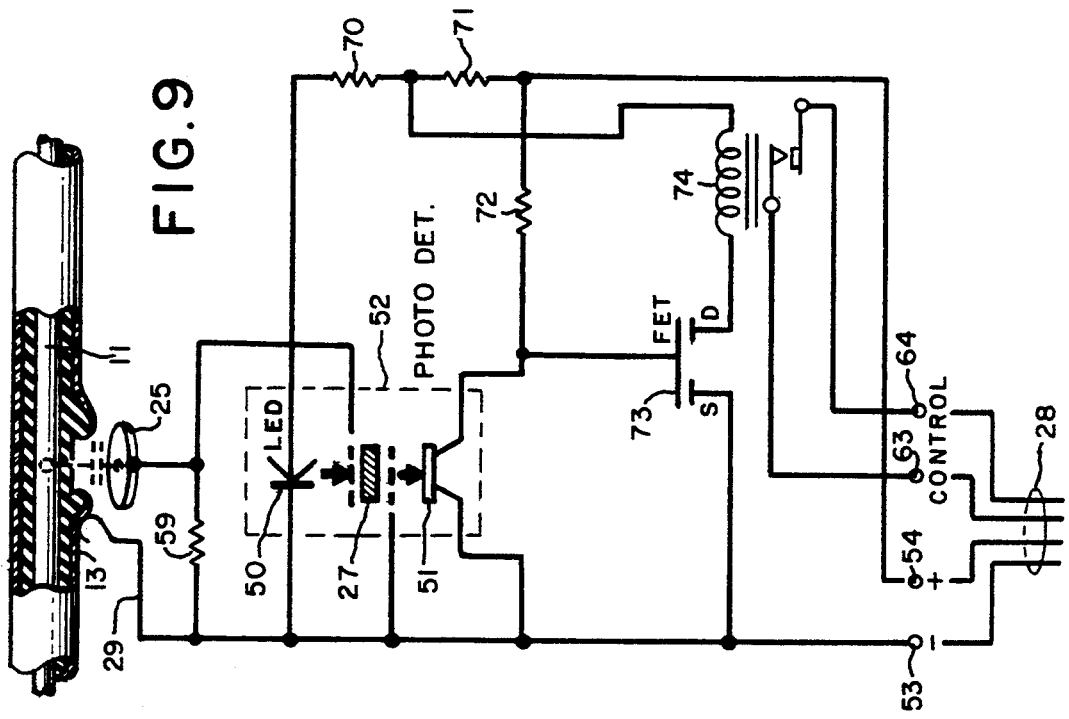
FIG. 9 is a schematic diagram of an alternate embodiment of the three-phase voltage monitor.

Referring to FIG. 9, in an alternative embodiment the voltage monitor monitors only for an under-voltage condition. In this embodiment, power is supplied to the voltage monitor as before by way of contacts 53 and 54, which may be contained in housing 22 and connected through cable 28 to a remote DC source. LED 50 is powered from this source through resistors 70 and 71, and phototransistor 51 is connected to the source through a resistor 72. A threshold level for actuation of the alarm circuit is established by a field effect transistor 73, which is connected to a relay 74.

As the voltage level of the source increases to a user-designated minimum level, the light incident on phototransistor 51 decreases and the impedance of the phototransistor increases. This increases the voltage applied to the gate electrode of FET 73, eventually reaching the threshold of the device and actuating relay 74 as the system voltage reaches the minimum level. The relay contacts in turn provide a control signal at terminals 63 and 64 for actuating, through conductors in cable 28, a remote alarm or other switching function. Thus, the relay contacts are closed only when the system voltage exceeds the minimum level, and are open when system voltage is below the minimum level.

Concurrently with actuation of relay 75 the voltage drop across resistor 71 increases, causing LED 50 to produce less light. This in turn causes the impedance of phototransistor 51 to increase and thus provide a latching function which helps to maintain relay 74 energized.

Relay 74 continues to be energized until the voltage of the source increases, at which time the light incident on photodetector 51 increases and the impedance of the photodetector decreased to a level where FET 74 is no longer conductive. At this time relay 74 is de-energized, the relay contacts open and the control effect is no longer present on terminals 63 and 64.

It will be appreciated that while the optical shutters of the illustrated embodiments have been shown as Liquid Crystal Devices, it is possible to use other high impedance devices, such as Kerr cells, wherein a dielectric under electrostatic stress becomes doubly refracting so as to convert plane polarized light to elliptical polarization. Moreover, while the system has been shown in conjunction with a non-metallic type test point, the invention may also be utilized in conjunction with a metallic test point by replacing the metallic pickup plate with an exposed spring contact.

While particular embodiments of the invention have been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

I claim:

1. A voltage monitor for monitoring the voltage level of an AC power system having a range of acceptable voltage levels, comprising:
   a light source;
   a photodetector responsive to light emitted by said light source;
   a high impedance optical shutter device comprising a pair of electrodes disposed in operative association with a layer of voltage-responsive light controlling material;
   said high impedance optical shutter device being arranged between said light source and said photodetector whereby the intensity of light emitted by said light source and impinging on said photodetector varies as a function of the transmissivity of said optical shutter;
   first circuit means for capacitively coupling said electrodes of said high impedance optical shutter device to the AC power system whereby the transmissivity of said device to light varies as a function of the voltage level of the system; and
   second circuit means including said photodetector and responsive to the intensity of light impinging on said photodetector for producing an output signal upon the voltage level of the AC power system falling outside of the range of acceptable voltage levels.

2. A voltage monitor as defined in claim 1 wherein said first circuit means include capacitive coupling means for forming a non-ohmic capacitive coupling to the AC power system.

3. A voltage monitor as defined in claim 1 wherein said high impedance optical shutter device comprises a liquid crystal device.

4. A voltage monitor as defined in claim 1 wherein said light source comprises a light emitting diode.

5. A voltage monitor as defined in claim 1 wherein said photodetector is a phototransistor.

6. A voltage monitor as defined in claim 1 wherein said second circuit means include first field effect transistor means having a predetermined operating threshold corresponding to one extent of the range of acceptable AC power system voltage levels.

7. A voltage monitor as defined in claim 6 wherein said second circuit means further include second field effect transistor means having a predetermined operating threshold corresponding to the other extent of the range of acceptable AC power system voltage levels.

8. A voltage monitor as defined in claim 1 wherein said light source is powered by the AC power system.

9. A voltage monitor as defined in claim 8 wherein said light source comprises a light emitting diode electrically coupled to the AC power system.

10. A voltage monitor as defined in claim 9 wherein said light emitting diode is capacitively coupled to the AC power system.

11. A voltage monitor for monitoring the voltage level of an AC power system having a range of acceptable voltage levels, comprising:

light source means comprising a light emitting diode capacitively coupled to the AC power system to receive operating power therefrom;

a photodetector responsible to light emitted by said light source;

a high impedance optical shutter device comprising a pair of electrodes disposed in operative association with a layer of voltage-responsive light controlling material;

said high impedance optical shutter device being arranged between said light emitting diode and said photodetector whereby the intensity of light emitted by said diode and impinging on said photodetector varies as a function of the transmissivity of said optical shutter;

first circuit means for capacitively coupling said electrodes of said high impedance optical shutter device to the AC power system whereby the transmissivity of said device to light varies as a function of the voltage level of the system; and second circuit means including said photodetector and responsive to the intensity of light impinging on said photodetector for producing an output signal upon the voltage level of the AC power system falling outside of the range of acceptable voltage levels.

12. A voltage monitor as defined in claim 11 wherein said high impedance optical shutter device comprises a liquid crystal device.

13. A voltage monitor as defined in claim 11 wherein said light detector comprises a phototransistor.

14. A voltage monitor as defined in claim 13 wherein said second circuit means include first field effect transistor means coupled to said phototransistor and having a predetermined operating threshold corresponding to one extent of the range of acceptable AC power system voltage levels.

15. A voltage monitor as defined in claim 14 wherein said second circuit means further include second field effect transistor means having a predetermined operating threshold corresponding to the other extent of the range of acceptable AC power system voltage levels.

* * * * *